United States Patent [19]
McCoy et al.

[11] Patent Number: 5,838,450
[45] Date of Patent: Nov. 17, 1998

[54] DIRECT RETICLE TO WAFER ALIGNMENT USING FLUORESCENCE FOR INTEGRATED CIRCUIT LITHOGRAPHY

[75] Inventors: John H. McCoy, San Carlos; Martin E. Lee, Saratoga; Kyoichi Suwa, San Mateo, all of Calif.

[73] Assignee: Nikon Precision Inc., Belmont, Calif.

[21] Appl. No.: 457,710

[22] Filed: Jun. 2, 1995

Related U.S. Application Data

[63] Continuation of Ser. No. 210,968, Mar. 21, 1994, abandoned.

[51] Int. Cl.$^6$ .................................................. G01B 11/00
[52] U.S. Cl. ........................... 356/401; 356/399; 250/548
[58] Field of Search ..................................... 356/401, 399; 250/458.1, 459.1, 461.1, 491.1, 548; 378/33, 34, 206

[56] References Cited

U.S. PATENT DOCUMENTS

| | | | |
|---|---|---|---|
| 4,449,824 | 5/1984 | Matthews | 356/351 |
| 4,667,109 | 5/1987 | Kano | 250/461.1 |
| 4,697,087 | 9/1987 | Wu | 250/548 |
| 4,929,083 | 5/1990 | Brunner | 356/400 |
| 5,131,755 | 7/1992 | Chadwick et al. | 356/446 |
| 5,148,214 | 9/1992 | Ohta et al. | 355/43 |
| 5,153,678 | 10/1992 | Ota | 356/401 |
| 5,194,893 | 3/1993 | Nishi | 355/53 |
| 5,262,822 | 11/1993 | Kosugi et al. | 355/53 |
| 5,506,684 | 4/1996 | Ota et al. | 356/401 |

FOREIGN PATENT DOCUMENTS 63-237521  10/1988  Japan .

OTHER PUBLICATIONS

J.M. Lavine, et al., "A direct–reticle–referenced alignment system", *SPIE*, vol. 538 Optical Microlithography IV, 1985, pp. 57–69.

H. Sewell, et al., "0.10–Micron overlay for DRAM production using Step and Scan", *SPIE*, vol. 1264 Optical/Laser Microlithography III, 1990, pp. 252–262.

*Primary Examiner*—Frank G. Font
*Assistant Examiner*—Robert Kim
*Attorney, Agent, or Firm*—Skjerven, Morrill, MacPherson, Franklin & Friel; Norman R. Klivans

[57] ABSTRACT

A mask alignment system for integrated circuit lithography achieves reticle to wafer referencing. A detection system located below the main projection lens detects the image of reticle alignment marks while also detecting wafer alignment marks. The reticle marks are imaged in light at the exposure wavelength. A first detection method images the fluorescence produced in the photoresist by the reticle mark images. A microscope located below the main projection lens produces the image and also images the wafer marks with broadband non-actinic illumination. The second method images the reticle marks in exposure light using a microscope which images and detects the exposure wavelength while maintaining the illumination and detection of the wafer marks. The third method collects directly both the exposure light and fluorescent light that is scattered and reflected from the wafer surface; the presence of wafer alignment marks changes this light collection. Scanning the wafer relative to the reticle produces a signal indicating the relative position of reticle and wafer alignment marks. All three methods provide information for complete field-by-field alignment including offsets, reticle-to-wafer magnification, rotation, and skew for both step-and-repeat and scanning exposure systems.

30 Claims, 10 Drawing Sheets

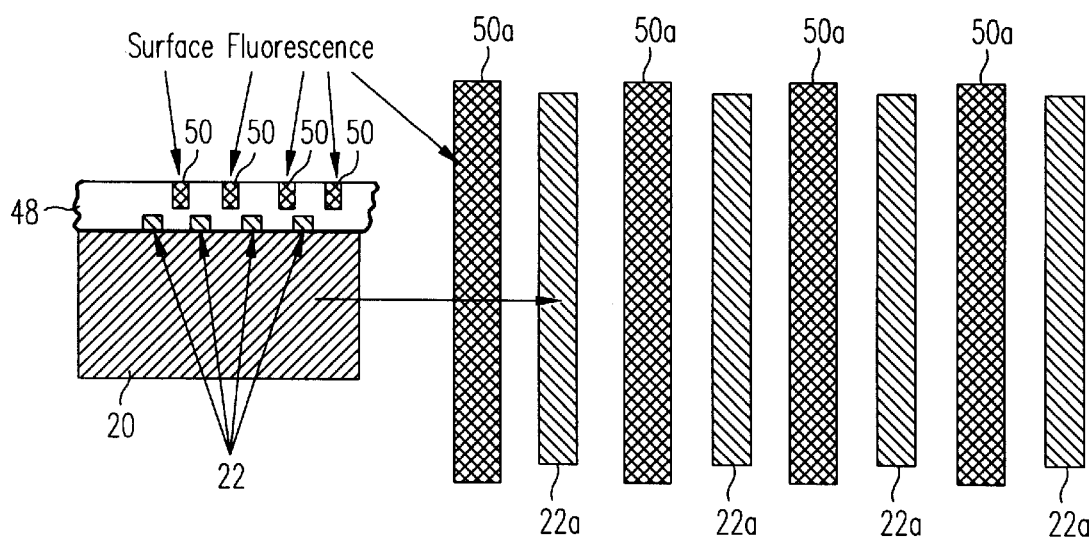
FIG. 3
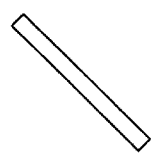   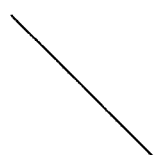   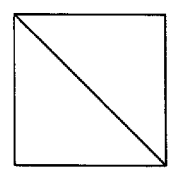   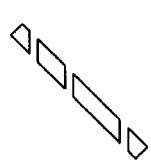
FIG. 4a    FIG. 4b    FIG. 4c    FIG. 4d Scan Direction

DIRECT RETICLE TO WAFER ALIGNMENT USING FLUORESCENCE FOR INTEGRATED CIRCUIT LITHOGRAPHY

CROSS REFERENCE TO RELATED APPLICATION

This application is a continuation of application Ser. No. 08/210,968, filed Mar. 21, 1994, now abandoned.

BACKGROUND OF THE INVENTION

1. Field of the Invention

This invention relates to photolithography and more specifically to determining alignment of a reticle to a wafer for integrated circuit fabrication photolithography.

2. Description of the Prior Art

Photolithography for fabrication of integrated circuits is well known. A major problem is to determine accurately alignment of the masks (reticles), each of which carries the image of one layer of an integrated circuit, to the wafer on which these images are to be projected. The photolithography process projects these images onto a photoresist layer formed on the principal surface of the wafer, which then replicates the reticle image. The photoresist is then developed and serves as a pattern to etch the underlying wafer.

Numerous masks are used in the fabrication of any one integrated circuit, and it is important that all the masks be accurately aligned, to minimize overlay error between successive masks. To that end, modern photolithographic exposure tools employ high numerical aperture imaging optics to achieve sub-micron resolution.

It is well known to use indirect reticle to wafer referencing techniques as disclosed in R. Unger et al., "New i-Line and Deep UV Optical Wafer Steppers", *SPIE Vol.* 1463 *Optical Laser Microlithography IV* (1991), p. 725–742. In such indirect referencing, a "stage fiducial" alignment mark is provided on the stage that supports the wafer, the mark being located to the side of the wafer location. Then the reticle is aligned to this stage fiducial mark using imaging with exposure light. The distance from the stage fiducial mark to the indirect referencing system is calibrated using laser interferometry.

In a direct referencing technique as disclosed in U.S. Pat. No. 4,697,087, Sep. 29, 1987 to Wu et al. an "off optical axis" detector is located adjacent the main projection lens for detecting the wafer mark, while the reticle mark is detected by light passing backwards through the main projection lens, from the wafer to the reticle. A beam splitter in the main projection lens allows viewing and detection of both the reticle and wafer alignment marks. The reticle mark is imaged onto the wafer and reflected from the wafer surface, passing back through the optics of the main projection lens to the beam splitter. Thus the reticle mark is directly referenced to the wafer mark using the main projection lens optics. These optics are achromatic enough so that blue and green laser light can be imaged. This light is not "actinic" or exposing. In some such systems, the main projection lens optics are mostly reflecting and therefore naturally achromatic. Nikon and others use refracting lenses that are highly chromatic.

Such prior art systems to achieve reticle to wafer referencing have numerous disadvantages. Typically they require a special main projection lens, i.e. an achromatic lens operating at numerous wavelengths, or a special main projection lens to reduce aberration in other ways. Often such systems require monochromatic exposure light to be used for alignment, which is undesirable. The indirect referencing schemes tend to be less accurate than is desirable. Therefore none of the prior art reticle to wafer referencing systems are truly accurate while allowing use of other than special exposure/detection wavelengths and exposure lenses.

SUMMARY OF THE INVENTION

A goal of this invention is to achieve mask alignment (i.e., to detect misalignment) for integrated circuit lithography with reticle to wafer referencing using direct and on-axis detection, such as from a location below the main projection lens. The applications include both step-and-repeat and scanning exposure systems. (See U.S. Pat. No. 5,194,893.)

In accordance with the present invention, an under-lens detector (e.g., a microscope or other detector) detects the reticle mark image and the wafer image simultaneously but with differing illumination for each. Three methods are disclosed herein for referencing the reticle alignment mark to the wafer mark. All three have two significant advantages. First, only the exposure wavelength (not the detection light) passes through the main projection lens. Aberrations of the main projection lens (achromaticity) and anti-reflection coatings need not be designed for longer (non-actinic) wavelengths. This would be difficult or impossible at 248 and 193 nm, believed to be the exposure wavelengths of choice for the future. Second, the wafer marks are illuminated with long wavelength (non-actinic) light that easily penetrates the photoresist and produces an optimum image. The photoresist may be high absorbing to the active wavelength. In this case surface imaging techniques are employed.

The first method images fluorescence produced in the photoresist on the wafer by the reticle mark images. A microscope having optical elements located below the main projection lens observes the fluorescence. The microscope also images the wafer marks with broad band (non-actinic) illumination. The second method images the reticle marks in exposure light, also using a below-lens microscope, which in this case images and detects the exposure wavelength. The third method directly collects onto a detector both the exposure light and fluorescent light that is scattered and reflected from the wafer surface without use of microscope optics. The presence of the wafer alignment marks changes this light collection; hence scanning the wafer relative to the reticle in the third method produces a signal indicating the relative position of reticle and wafer alignment marks.

An application for all three methods is to step and repeat exposure systems, but they are especially advantageous for scanning exposure systems. More broadly, the application is to photolithography generally, and is not limited to integrated circuit fabrication, extending to alignment of an image source (reticle) to an object other than a wafer.

BRIEF DESCRIPTION OF THE DRAWINGS

FIG. 3 shows an image of fluorescent reticle marks and wafer marks in accordance with the apparatus of FIG. 2.

FIGS. 4a, 4b, 4c, 4d show beamsplitters for the apparatus of FIG. 2.

Identical reference numerals in various figures refer to identical or similar structures.

DETAILED DESCRIPTION OF THE INVENTION

Figure 1:
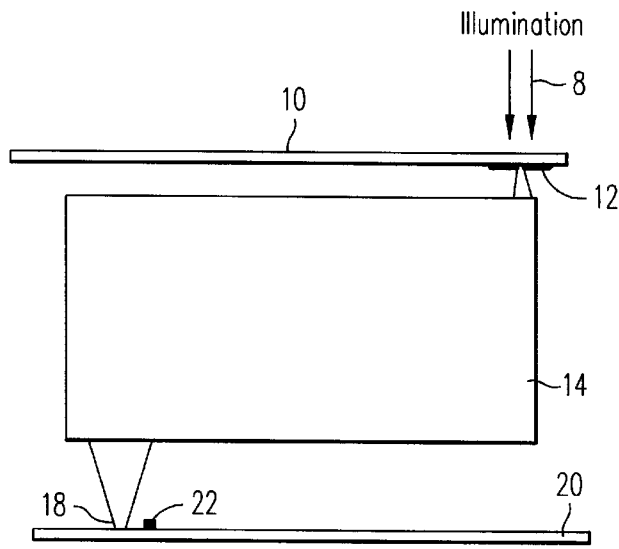
FIG. 1 shows an integrated circuit projection lithography system.

In accordance with the invention, an alignment mark on the reticle is imaged on a semiconductor wafer by the main projection lens; this image is detected below the main projection lens (at a location on a plane between the nearest end of the main projection lens and the wafer) in order to compare the location of the reticle mark with respect to marks formed on the wafer surface. FIG. 1 shows an integrated circuit projection lithography system; reticle mark 12 on reticle 10 is imaged onto semiconductor wafer 20 near wafer mark 22. It is understood that semiconductor wafer 20 rests on a conventional underlying support or stage, not shown for simplicity in FIG. 1 but illustrated in FIG. 13. Thus in FIG. 1 reticle 10 is conventionally supported on a reticle holder by vacuum adsorption. The wafer 20 rests on a wafer vacuum chucking holder mounted on an X–Y stage capable of fine rotational movement. In the step and repeat type of exposure system, the reticle holder and the X–Y stage are stationary at a predetermined positional relation during exposure. On the other hand in the scanning (step and scan scheme) type of exposure system, both the reticle holder and the X–Y stage move continuously in the X or Y direction during exposure.

The illumination 8 may be of the same character as that used on the remainder (i.e. the circuit pattern bearing area) of the reticle 10. For example, if the radiation for exposing the circuit pattern onto the wafer 20 has a selected center wavelength and bandwidth, the illumination 8 also has the same characteristics. Illumination 8 also may be from a special illuminator just for the reticle mark 12. In either the case, the illumination 8 wavelength is conventionally corrected in the main projection lens 14. Typically this wavelength is the main exposure wavelength, for instance 248 nm or 193 nm.

Reticle 10 conventionally is a fused silica plate, on the surface of which the integrated circuit pattern is etched in a chrome or other film. Reticle mark 12 is also etched in the chrome at the peripheral portion of the circuit pattern area, and used for location purposes in the image field of a projection optical system 14. In one embodiment, the optical projection system 14 includes a plurality of refractive optical elements (such as lenses) having high transparence in ultra violet region. Also, the optical projection system 14 may include reflective mirrors, or a combination of lenses and mirrors.

Reticle mark 12 typically lies in the stripe (not shown) that is conventionally reserved for separating adjacent integrated circuit chips (i.e., the kerf area). Reticle 10 also has patterns (not shown) for replicating wafer marks in the kerf area (as described in detail below). Main projection lens 14 images the pattern on reticle 10 onto the principal surface of wafer 20, typically with reduction in object-to-image size.

The image 18 of the reticle mark on the surface of wafer 20 hence is reduced in size from the actual reticle mark 12 by the projection lens 14. The principal surface of wafer 20 is conventionally photoresist coated and typically has the wafer alignment mark 22 placed (etched in its surface) by a previous lithography step. The object is to align the new reticle 10 pattern to a previously applied pattern on wafer 20. Thus it is important to relate the position of the reticle mark image 18 to the wafer mark 22. This is conventionally called reticle to wafer alignment referencing.

Three methods are disclosed hereinafter for detecting reticle mark image 18.

Method 1—Fluorescent conversion and Imaging Microscope

Actinic exposure wavelengths of 248 nm and 193 nm as used in photolithography cause almost all materials to fluoresce. Fluorescing is well known as light emission at a longer wavelength when a material is irradiated by a shorter wavelength. When irradiated by deep ultra violet (DUV) such as 248 and 193 nm, the fluorescence from photoresist can be at any longer wavelength. Fluorescent wavelengths between 800 nm and 400 nm are used herein for convenience of imaging and detection. The fluorescence is typically over a limited bandwidth, but wide enough not to cause thin film interference. Fluorescence enhancers, also known as organic scintillators such as diphenyloxazole (DDO) and many others, may be mixed into or top-coated over the photoresist to increase fluorescence. Typically the amount of fluorescent enhancers used is such that about of the incident exposure light is sacrificed to fluorescence.

Figure 2:
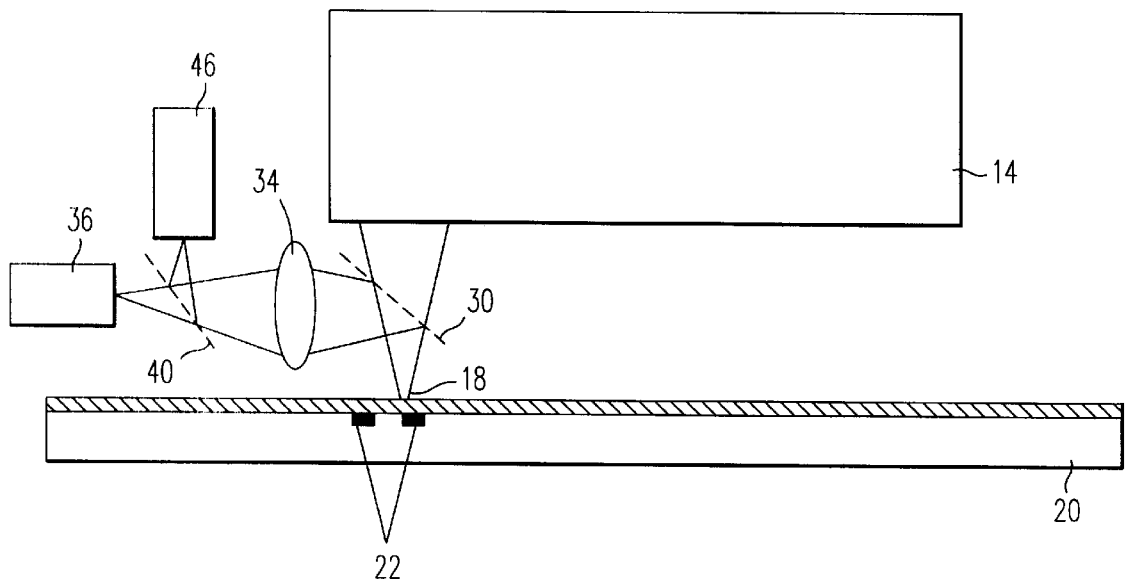
FIG. 2 shows an alignment system for the first and second detection methods.

In Method 1, the fluorescence is imaged by placing elements of a detecting microscope which are located below (relative to the reticle) the projection lens 14 as shown in FIG. 2. Typically the end of lens 14 is spaced about 15 mm from the surface of wafer 20. The microscope apparatus in FIG. 2 includes a first beamsplitter 30 which passes the reticle image 18 from main projection lens 14 and reflects the fluorescence from the resist-covered wafer 20 to the lens 34. Beamsplitter 30 also reflects the broad band illumination from broad band illuminator 46 and passes the wafer mark 22 light to the lens 34.

Lens 34 is the microscope objective which focuses the illumination and images both the fluorescence and the wafer mark 22 image onto the conventional CCD detector 36. The second beamsplitter 40 introduces the broadband illumination from broadband non-actinic illuminator 46, for imaging the wafer marks 22. This broadband illumination is such that it does not expose the photoresist.

CCD detector 36 produces an electronic image of both the fluorescence from the image of the reticle (the reticle itself is not shown here) and the broadband reflected image from the wafer marks 22. The image as seen in the microscope of the CCD detector 36 may look like the right-hand side of FIG. 3. The left-hand side of FIG. 3 is a cross-sectional view of wafer 20 showing wafer marks 22 and photoresist layer 48 with surface fluorescence 50 from the reticle image. (The resist may be highly absorbing of the exposure light, but only the surface fluorescence is needed).

The right-hand side of FIG. 3 shows in a top view the image of fluorescent reticle marks 50 and wafer marks 22 of the left-hand side of FIG. 3. Several grating-like marks are shown, but even a single mark is possible. The darker marks 50a correspond to the fluorescence from surface fluorescence marks 50; the lighter marks 22a correspond to the wafer marks 22. Marks in the orthogonal direction could be in the same field of view or in an adjacent field. Analysis of the relative position of the reticle mark 50 and the wafer mark 22 is a measure of alignment (or mis-alignment).

An advantage of the invention is that the broadband illumination and microscope can be optimized. Bright field or dark field may be used. The choice depends on the actual equipment in use; the use of bright field or dark field is well known in the art.

There are many possible shapes for alignment marks, such as parallel line patterns, patterns of squares, or others as known in the art and usable in accordance with the invention.

Figure 7:
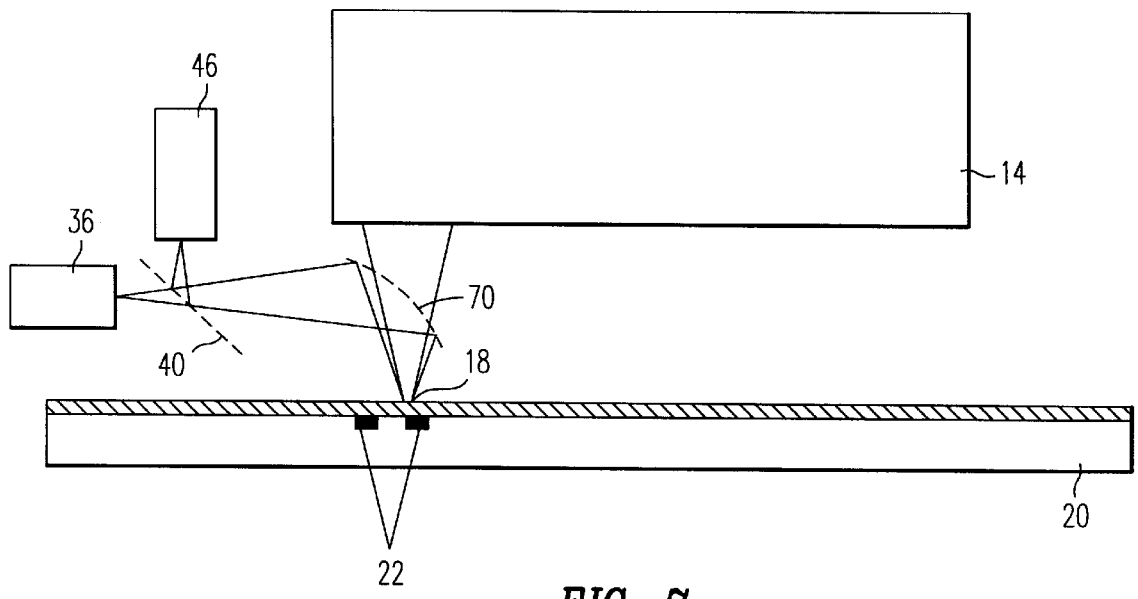
FIG. 7 shows use of an ellipsoidal reflector in a modified version of the apparatus of FIG. 2.

Beamsplitter 30 of FIG. 2 may be of several configurations as shown in FIGS. 4a, 4b, 4c, 4d. Beam splitter 30 passes the image of the reticle mark without distortion. Beam splitter 40 is passing both the wafer mark image and fluorescence image together. Any deviation or distortion will affect both images (unless chromatic). In FIG. 7, beamsplitter 40 must pass actinic light but this is easy for thin fused silica. Beamsplitter 30 passes the image of the reticle while reflecting the light that comes from the wafer.

It is important that the beamsplitter 30 not disturb the reticle image. The flat prism of FIG. 4a and the cube of FIG. 4c undesirably cause the focus of the reticle image to shift with respect to the main integrated circuit image. The flat prism of FIG. 4a also causes a lateral deviation. The pellicle of FIG. 4b avoids the shifts by being very thin, but it is fragile and its material may not withstand DUV-induced solarization (blackening). Each type of beamsplitter in FIGS. 4a, 4b, 4c also is only partially reflecting and transmitting, hence some light is lost to the undesired direction.

Figure 5:
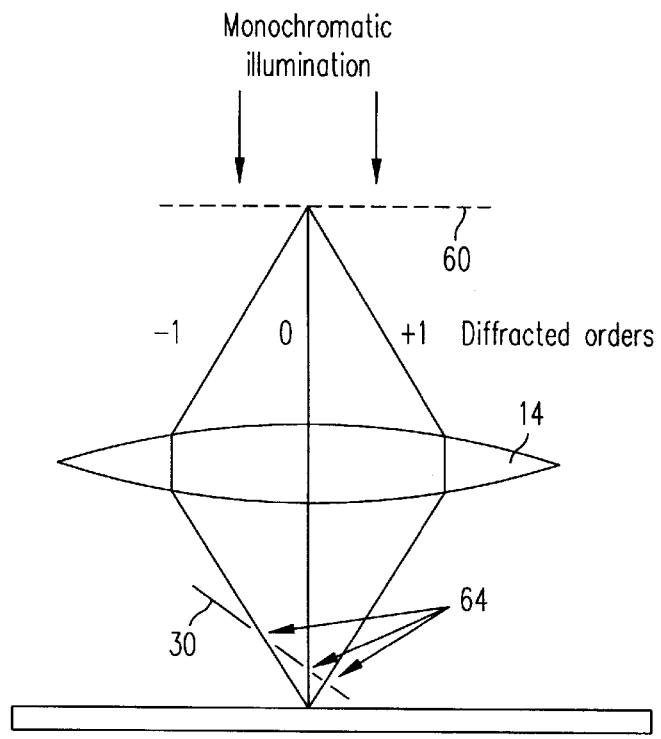
FIG. 5 shows an apertured prism for the apparatus of FIG. 2.

The apertured prism beamsplitter of FIG. 4d (shown in cross section) is an improvement over the other illustrated beamsplitters. If as shown in FIG. 5 the reticle mark is a grating 60 of the period p, diffraction theory shows that the projection lens 14 will pass only the diffracted orders such as 0, −1, and +1. The apertures 64 in the apertured beamsplitter 30 pass the diffracted orders necessary to reconstruct the grating image 60 on the wafer 20. The fluorescent and broadband light that reflects from the wafer 20 is not monochromatic. The rays will have all angles, and very little light will be lost to the beamsplitter apertures 64. A typical reticle mark grating size would by 60 μm×80 μm, with a 4 μm spacing between grating lines which are 4 μm wide (i.e., an 8 μm period). The dimensions are not critical except that the total mark image field is small, such as 60 μm×80 μm.

Figures 6A, 6B:
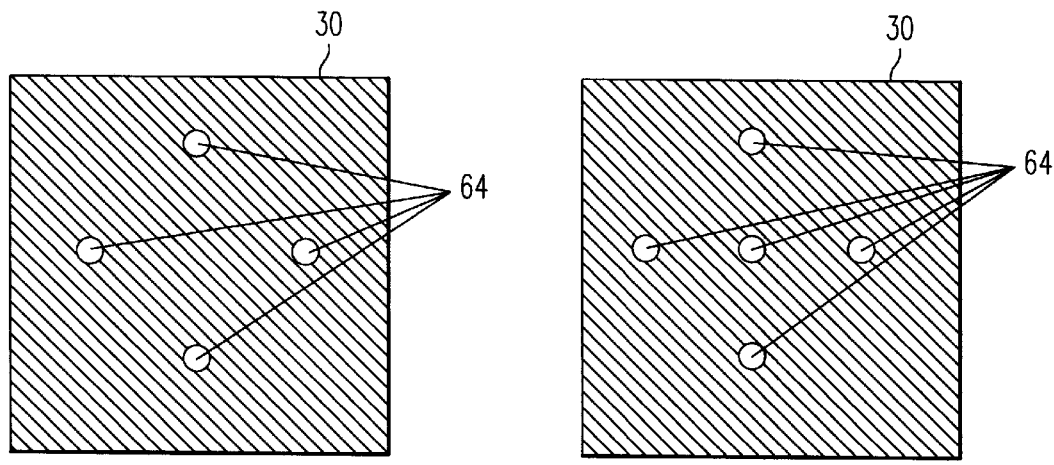
FIGS. 6a, 6b show apertures as used in the prism of FIG. 5.

To pass orthogonal grating images 60 from the reticle, a minimum of four and possible five beamsplitter apertures 64 are required, arranged as shown respectively in FIGS. 6a, 6b which show a top view of beam splitter 30. The apertures 64 in FIGS. 6a, 6b are oriented to pass the three diffracted orders from each grating. The center aperture of the 5 aperture beamsplitter of FIG. 6b passes the 0-order of both gratings. It is possible that best imaging and collection of wafer light will occur with the center aperture omitted, as in the 4 aperture beamsplitter version in FIG. 6a.

A further refinement (shown in FIG. 7) of the apparatus of FIG. 2 substitutes an ellipsoidal reflector 70 for both the first beamsplitter 30 and the lens 34 of FIG. 2. Ellipsoidal reflector 70 has apertures (similar to those shown in FIGS. 6a, 6b) and focuses the light from the wafer 20 onto the CCD detector 36. The apertures in the reflector 70 function to pass the reticle image from main projection lens 14 to the surface of wafer 20.

Method 2—Direct Imaging of reticle mark image in actinic light.

This method is similar to Method 1, except no fluorescent conversion occurs. The apparatus used is similar to that described above in FIG. 2 and following, with the following changes:

The lens 34 in the microscope (see FIG. 2) images the exposure wavelength, and the CCD 36 detects the exposure wavelength. There is no need for fluorescent conversion. The second beamsplitter 40 is compatible with the exposure wavelength. The surface fluorescence 50 of FIG. 3a is replaced by the scattered and reflected exposure wavelength light from the photoresist 48 surface and underlying layers.

The ellipsoid reflector 70 of FIG. 7 is more easily used in this method with the exposure wavelength. Reflector 70 is naturally achromatic and has less absorption. The CCD 36 detects the exposure wavelength and is commercially available from e.g. Photometrix Ltd. (The DUV CCD uses a fluorescent converter coated on the CCD surface.)

Method 2 still makes use of the broadband illumination and imaging of the wafer marks. This is important in case the photoresist is opaque to the actinic wavelength. Of course if the resist is partially transparent or locally removed only at the portions over the wafer marks, the wafer mark image will consist of both actinic and broadband light.

In a variation of Method 2, the reticle and wafer mark images are viewed separately. This can be done by two methods:

1) Sequential illumination in which the actinic light source is either shuttered or is a pulsed laser. The broadband light source can be shuttered or be a Xenon flash lamp. The reticle and wafer mark images would appear on sequential frames of the CCD video signal.

2) A movable spectral filter is placed in front of the CCD. The filter would provide sequential images to the CCD as above.

Figure 8:
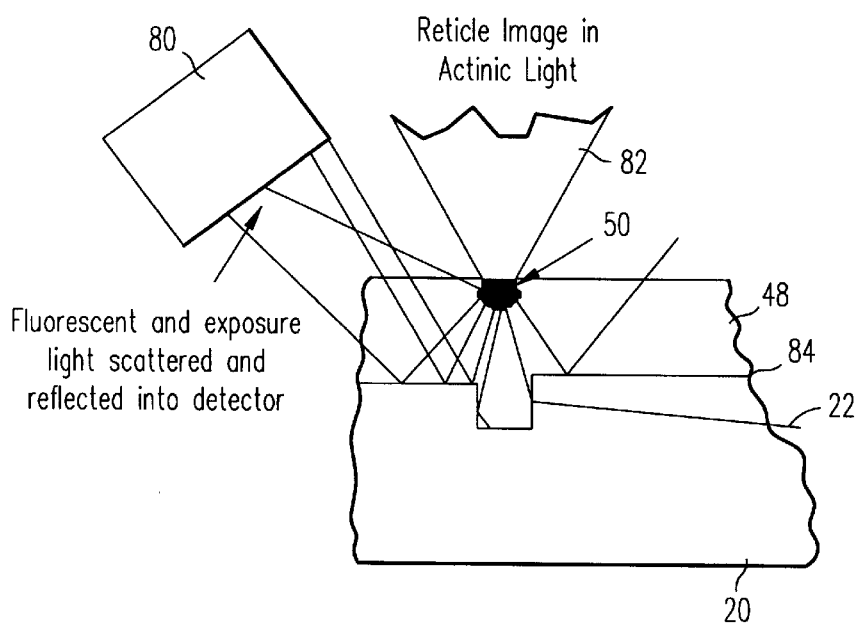
FIG. 8 shows an apparatus for the third method of detecting reticle marks.

Method 3—Direct detection of fluorescent and exposure light after interaction with wafer marks This method uses an apparatus somewhat similar to that of FIG. 2, but there are no microscope optics. Instead as shown in FIG. 8 a scanning detector 80 is used.

The reticle mark image 82 (in actinic light) from main projection lens 14 (not shown) is focused on the upper surface of photoresist 48. Typically photoresist 48 is about 1 m thick, and wafer mark 22 is about 2 to 4 μm wide. Fluorescent source 50 (caused by the reticle mark image 82) is about 0.5 82 m wide and 0.1 μm thick, but these dimensions are not critical. The fluorescent source 50 may be most effective if its length and width is the same as that of wafer mark 22. Fluorescent source 50 may have a three dimensional character. It remains stationary in space, and thus moves through the resist in a lateral direction as the wafer is scanned. Depending upon the photoresist 48 absorption, the exposure light penetrates partially or completely into photoresist 48. FIG. 8 shows a surface-type absorption with fluorescent light rays being generated from fluorescent source 50. Both the fluorescent light rays and the exposure light rays are reflected from the resist-wafer interface 84. The wafer mark 22 interrupts this reflection. If the wafer 20 and the reticle (not shown) are moved in a scanning motion with respect to each other, the light reflected into the (e.g. photodiode) detector 80 is modulated depending upon the relative position of the reticle image 82 and the wafer mark 22. The expected signal at the detector 80 is shown in FIG.

9a. Either the wafer 20 or the reticle or both are moved for the scanning, as shown in FIG. 9b.

Figure 9A:
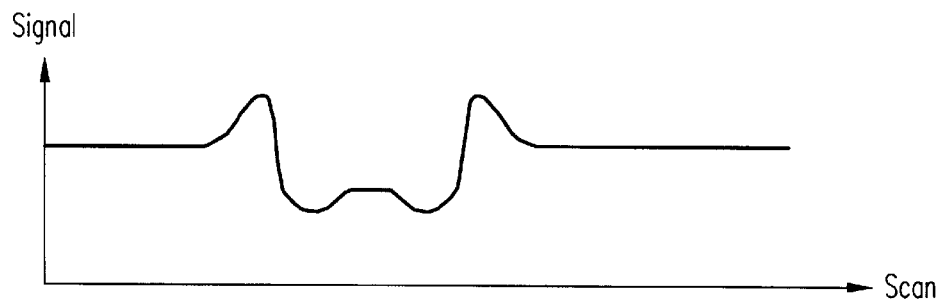
FIGS. 9a, 9b show respectively a signal at the detector of the apparatus of FIG. 8 and scanning of a wafer.
Figure 9B:
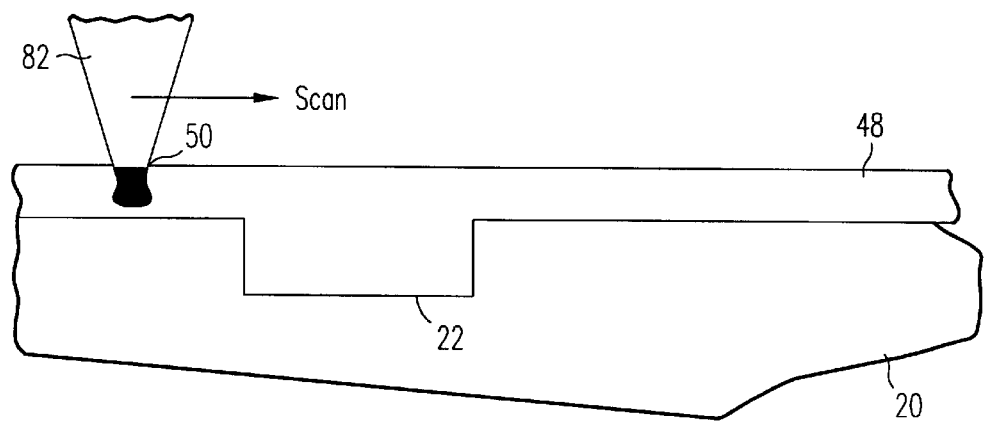

The exact form of the signal at the edges of the wafer mark 22 in FIG. 9a may vary. In addition, a grating mark 22 would normally be used. The signal in FIG. 9a would then be cyclic with the grating period. Normally only one period of the cycle is used.

Figure 10A:
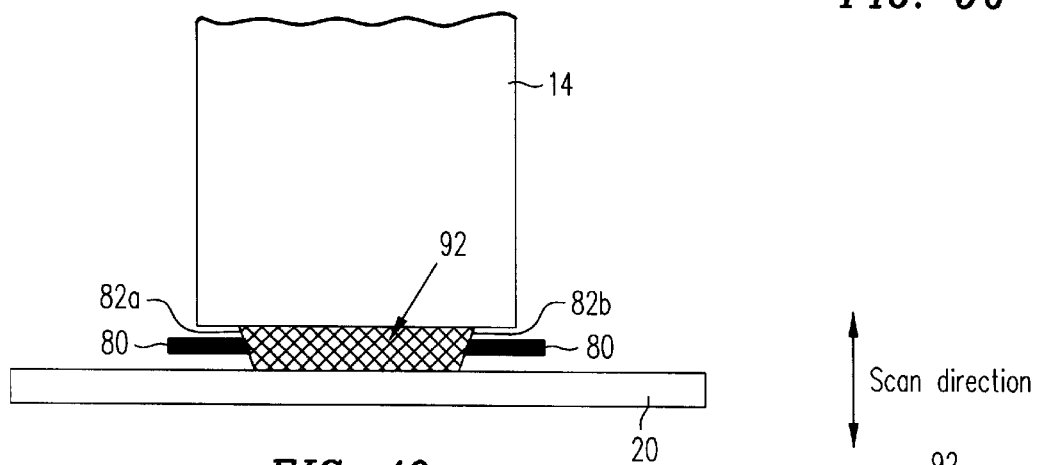
FIGS. 10a, 10b, 10c, 10d show detail of the apparatus of FIG. 8.

Collection efficiency of the scanning detector 80 in FIG. 8 is relevant. One detector 80 embodiment is shown in FIG. 10a in a side view and in FIG. 10b in a top view of the scan field. This embodiment is for a scanning lithography system. The light forming the main image of the reticle circuit pattern is confined to a rectangle shape 92 in the circular image field of the projection lens 14. It is useful to be able to detect alignment marks at each end of the rectangle as shown in FIG. 10b.

Figure 10B:
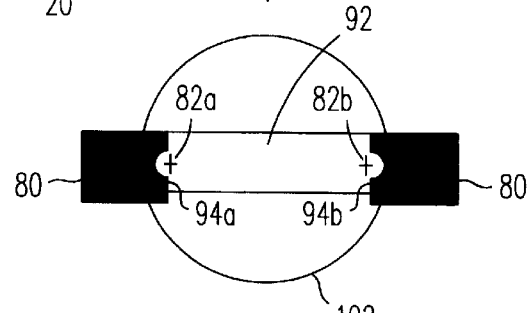

Detector 80 in FIGS. 10a, 10b has a flat detecting surface (like a plate). This flat surface of detector 80 facing the wafer 20 is sensitive to light coming from the wafer 20, both fluorescent and exposure light. In the top view of FIG. 10b showing the entire usable image field 102, semi-circular cut-outs 94a, 94b in the detector 80 allow the mark image 82a, 82b of the reticle to pass. Collection efficiency is very high. If the alignment marks 20 (not shown in FIGS. 10a, 10b) are gratings arranged at ±45 degrees to the scan direction, alignment position in orthogonal directions can be measured.

Figure 10C:
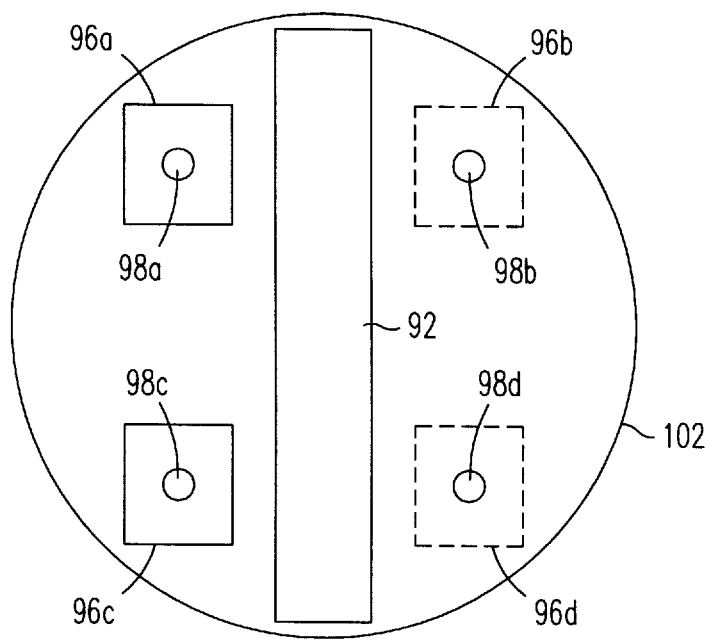
Figure 10D:
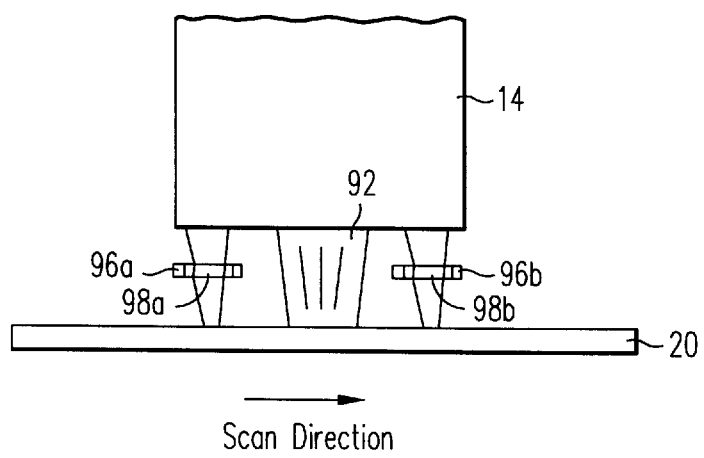

An advantage of Method 3 is that it can be applied to the end of the scan field, while Methods 1 and 2 cannot. The application of alignment to the unused part of the field is believed to be novel herein. Method 3 may take advantage of this. FIGS. 10c, 10d show that this approach is very similar to the back scatter detector in E-beam lithography, with advantageously a full $2\pi$ collection solid angle (except for the holes 98a, 98b, 98c, 98d in respectively detectors 96a, 96b, 96c, 96d in FIGS. 10c, 10d). Use of a rectangular shape for the detectors is not critical; they may be of any shape, so long as light collection is adequate.

In FIG. 10c, for an alternate scan detection compared to that of FIG. 10b, reticle mark image 82 and main image 92 are as in FIG. 10b. Here the rectangular unused parts of the field at detectors 96a, 96b, 96c, 96d each include respectively a circular hole (cut out) 98a, 98b, 98c, 98d for the reticle image mark. Alternatively, the detector could cover the entire plane with cutouts for the reticle mark beams and the main exposure field.

FIG. 10d is a side view (corresponding to FIG. 10a) of the use of the technique of FIG. 10c, showing the scanning direction.

Alignment Detection Systems

The arrangement of the alignment detection system applies to all three methods described above. While Method 3 does not use microscopes, it does have detectors which use alignment detection as disclosed hereinafter. Three alignment detection apparatus are described hereinafter.

Figure 11:
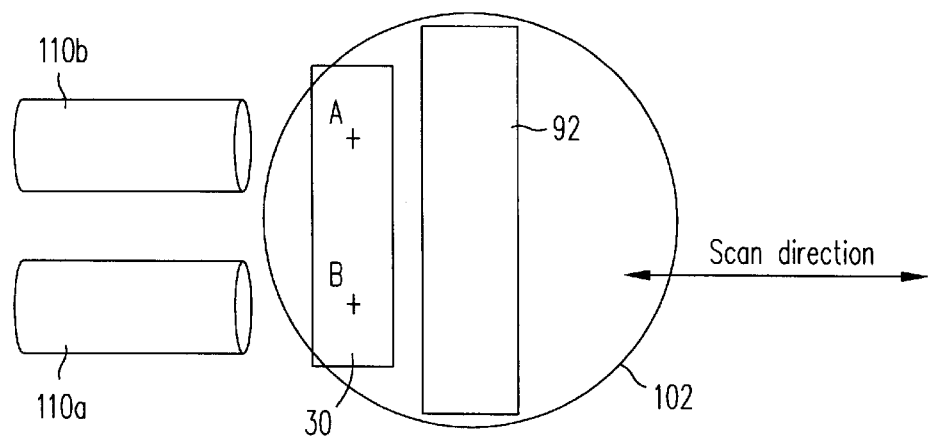
FIG. 11 shows a detection system for the apparatus of FIG. 2.

A first alignment detection apparatus uses fixed microscopes (or detectors for Method 3) located below the projection lens in a scanning system. In a scanning system only a rectangular part of the circular optical field is used for imaging. In FIG. 11, the circular field 102 of the projection lens (not shown) is shown with the scanning image field 92, here conventionally a narrow rectangle. On each side of field 92 is room for the beamsplitter 30 and the objective lenses 110a, 110b of two alignment microscopes (or two detectors for Method 3). Each of these microscopes is the same as the microscope shown in FIG. 2 in a side view. (The lens 34, second beamsplitter 40, and CCD 36 for each microscope are omitted from FIG. 11.) The beamsplitter 30 and the microscope lenses 110a, 110b (or detectors for Method 3) can remain stationary because the side of the field 92 is not used.

Alternatively, the microscope lenses may be actively moved in a direction orthogonal to the scanning exposure direction, depending on the mark arrangement. The microscope lenses can be fixed or made adjustable to accommodate varying mark positions. An additional pair of microscopes or detectors for method 3 (both not shown) may be placed on the right side of the scanning image field 92 since scanning will be in both directions (see FIG. 14b).

The separation of the two alignment mark areas (the crosses here designated A and B) in FIG. 11 allows the magnification error detection of the projection lens with respect to the reticle and wafer to be measured, in addition to rotation and offset error detection. These measurements and subsequent correction allow very accurate alignment.

The detectors used for Method 3 as described above can also be arranged under the projection lens to collect light from the mark areas A and B. In this case, the detectors may have a full circular hole to pass the reticle image, and completely surround the mark area for better detection (not shown).

In a second detection apparatus, movable microscopes (or movable detectors for Method 3) are located below a step-and-repeat main projection lens. In a step-and-repeat system, there is no large unused image field. In this case the microscope and beamsplitter assemblies (or detectors) are moveable. They are moved into place for alignment and then moved out for exposure. The position of the microscopes in measurement position is not critical because the measurements are between the two types of marks. Position in the field hence is not critical.

A third detection apparatus uses a combination of off-axis and under-projection lens alignment systems. It is possible to combine existing alignment techniques in an off-axis apparatus with the under-projection lens system described here. Examples are the HeNe laser system interferometric alignment and laser site alignment in current use. Such systems are proven, fast and described in (1) S. Murakami et al. "Laser Step Alignment for a Wafer Stepper", *SPIE Vol. 538 Optical Microlithography IV* (1985), p. 9–10 and (2) K. Ota et al. "New Alignment Sensors for Wafer Stepper", *SPIE Vol. 1463 Optical/Laser Microlithography IV* (1991), p. 304–314.

Figure 12A:
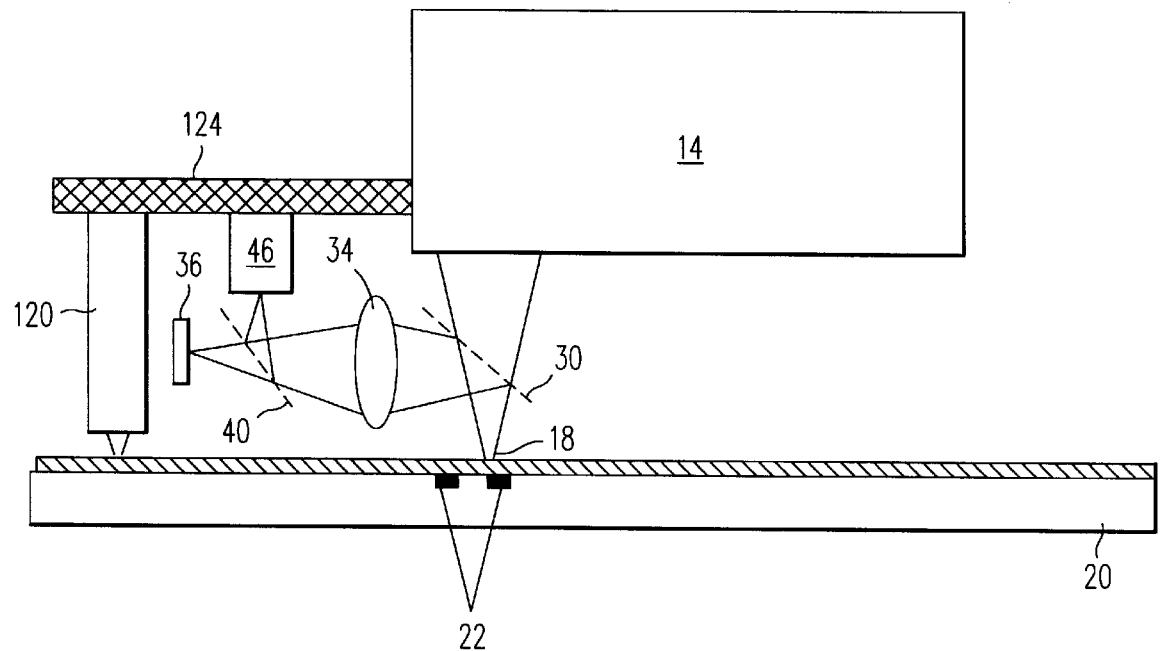
FIGS. 12a, 12b, and 12c show detail of the detection system of FIG. 2.
Figure 12B:
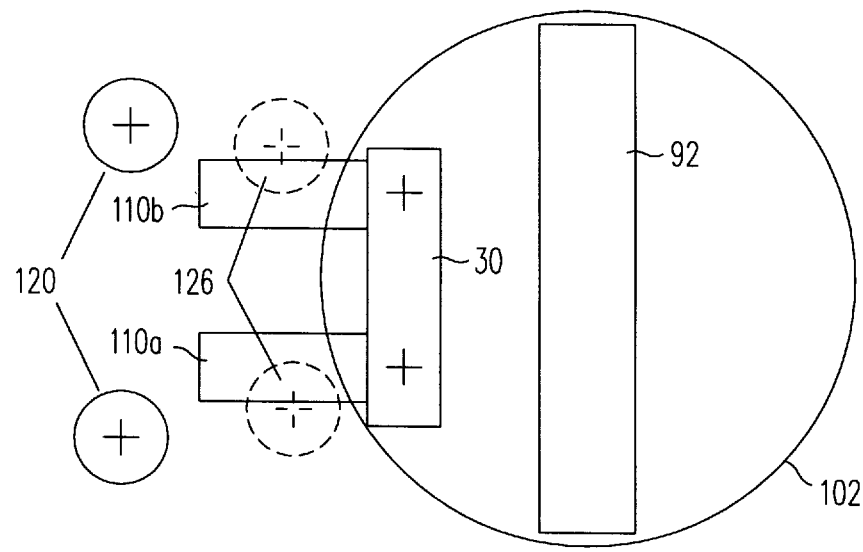

The third detection apparatus is shown in FIGS. 12a, 12b which are respectively side and bottom views. The conventional off-axis alignment system 120 is rigidly attached by mount 124 to the under-projection-lens microscopes (or detectors for Method 3) 110a, 110b shown here to the left of exposure field 92. Microscopes 110a, 110b may be arranged to the right of exposure field 92. Mount 124 is also rigidly attached to the main projection lens 14 or other suitable reference. This rigid connection assures that the distance between the top measurement systems and to the reticle can be calibrated and will remain steady. Several positions for the off-axis systems are possible; two (alternative) positions 120, 126 are shown FIG. 12b.

Because of direct referencing, the microscope elements of Method 1 and 2 are not critical in terms of position; some mechanical drift is acceptable. Similarly, the detectors in Methods 1, 2, 3 are not critically positioned. The off-axis detector 120 must remain stationary with respect to the reticle and projection system. The advantage of the apparatus of FIG. 12a is that recalibration is easy using the under-lens system The under-lens system of Methods 1, 2, or 3 may be not suitable for all alignment measurements. For instance, Method 3 is slow because of the additional scan required. Thus the off-axis system can be used for speed, after calibration by Method 1, 2, or 3.

Figure 12C:
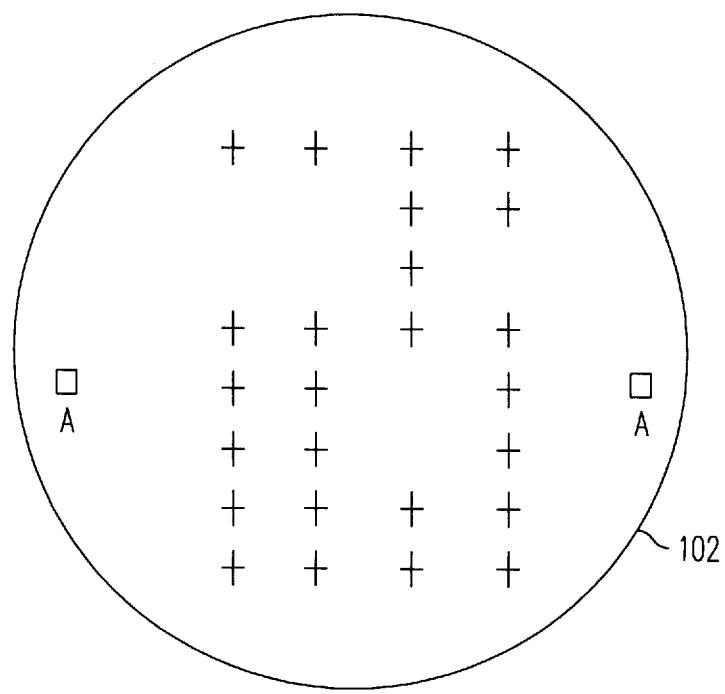

This technique is illustrated in FIG. 12c, and involves:
1. Measure sites A with both systems.
2. Measure other sites (+'s) with the off axis system.

The off-axis system 120 in FIG. 12a could measure quickly sites 2-A1 and 2-B1 (see FIG. 14b) before each scan (and possibly after each scan). The calibration at site A insures accuracy.

Integrated Circuit Projection Lithography System

Figure 13:
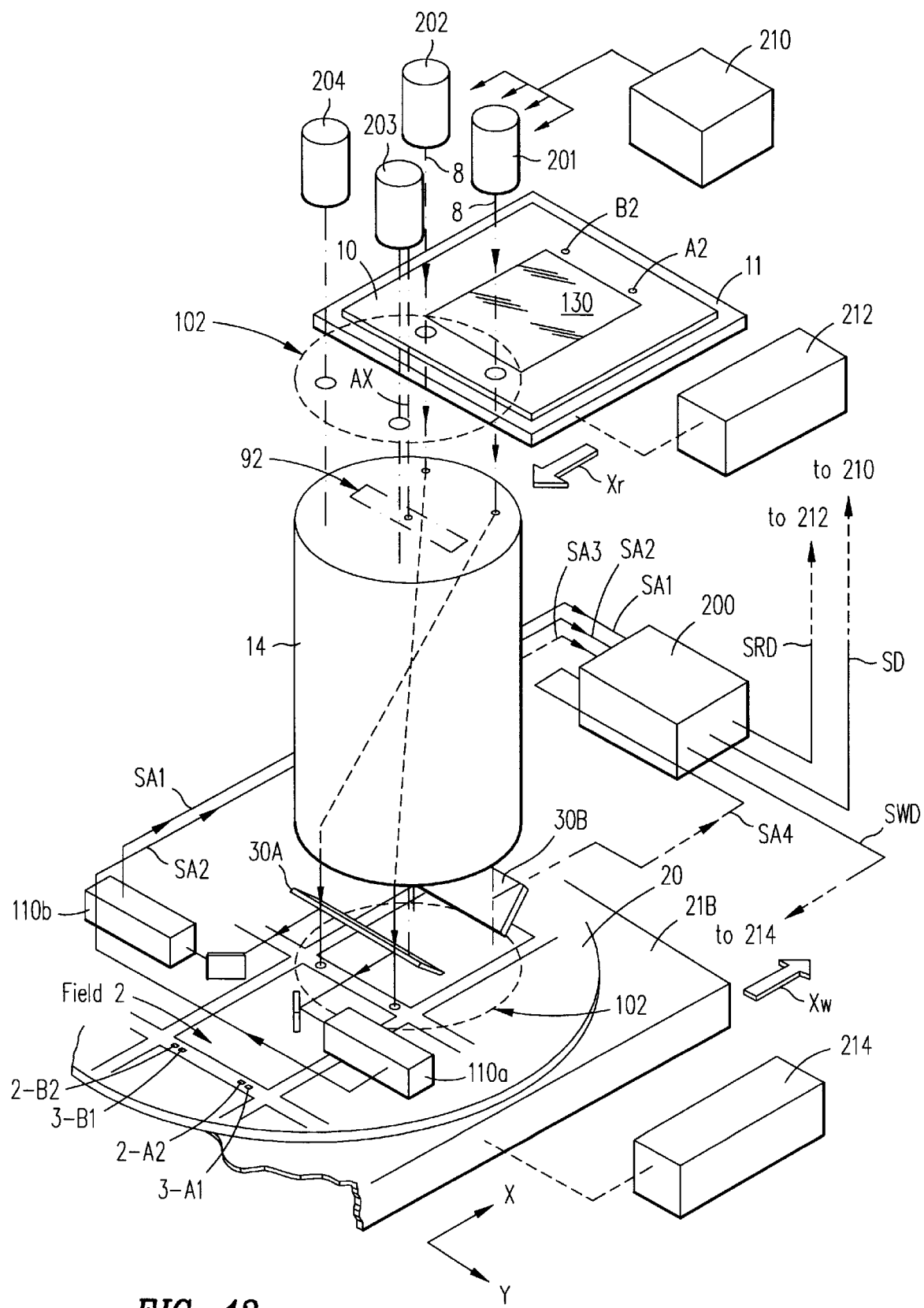
FIG. 13 shows a perspective view of an integrated circuit projection lithography system in accordance with the invention.

FIG. 13 is a perspective view of an integrated circuit photolithography projection system in accordance with the invention and applicable to above described Methods 1 and 2, and with readily apparent modifications to Method 3. This shows considerable more detail than does corresponding FIGS. 1 and 2. Where reference numbers in FIG. 13 are the same as reference numbers in other figures, they refer to similar or identical structures.

In FIG. 13, the reticle 10 is conventionally supported by a reticle holder 11 by vacuum adsorption, and the semiconductor wafer 20 rests on a wafer vacuum chucking holder (not shown) mounted on an X–Y stage 21B capable of fine rotational movement. In the step and repeat exposure system, the recticle holder 11 and the X–Y stage 21B are stationary at a predetermined positional relation during exposure via main projection lens 14. On the other hand in the scanning (step and scan scheme) exposure system, both the reticle holder 11 and the X–Y stage 21B are moved continuously in the X or Y direction during exposure. Other elements shown in FIG. 13 include beam splitters 30A, 30B located on both sides of field 92. Point illuminators 201, 202, 203, and 204 correspond to reticle marks A1, B1, A2, B2 described below with reference to FIG. 14. The selecting point illuminators 210 operate in response to the reticle X position and are controlled by signal line SD. The reticle holder driving unit 212 conventionally includes laser interferometers. The wafer stage driving unit 214 conventionally includes laser interferometers also.

The alignment and positioning main controller 200 receives the detecting signal (or alignment information). Signal lines SA1 through SA4 carry signals produced from microscopes 110a, 110b etc. via beams splitters 30A or 30B. Controller 200 generates command signals on line SD (for selecting point illuminators 210), line SRD (for reticle holder driving unit 212) and line SWD (for wafer stage driving unit 214) to align the positional relation between reticle 10 and wafer 20 and to scan reticle 10 and wafer 20. Here $X_R$ is the reticle scanning (for exposure) direction and $X_W$ is the wafer scanning (for exposure) direction.

Each of two point illuminators e.g. 201, 202 projects illumination beam (ultra violet) 8. Two reticle marks A1, B1 (see FIG. 14a below) are projected and imaged onto wafer 20. In this state, Field 2 is aligned with reticle 10 using signals on lines SA1, SA2 produced from microscopes 110a, 110b and the fine driving operation of reticle holder driving unit 212 (and/or wafer stage driving unit 214). Then the beam 8 is turned off; the reticle holder 11 and stage 21B are scanned to expose Field 2 with a circuit pattern 130 using the slit-shaped imaging light 92.

Alignment Sequences

Examples of alignment processes for a scanning projection system are described hereinafter. These examples point out the advantages of the above disclosed alignment Methods 1 to 3.

Figure 14A:
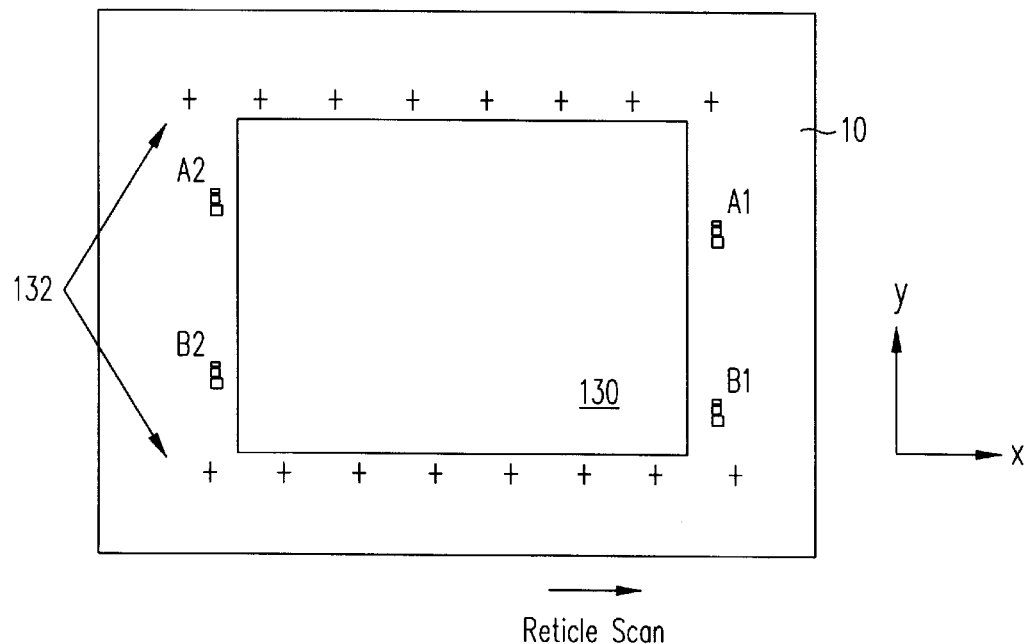
FIGS. 14a, 14b show a reticle measurement in accordance with the invention.
Figure 14B:
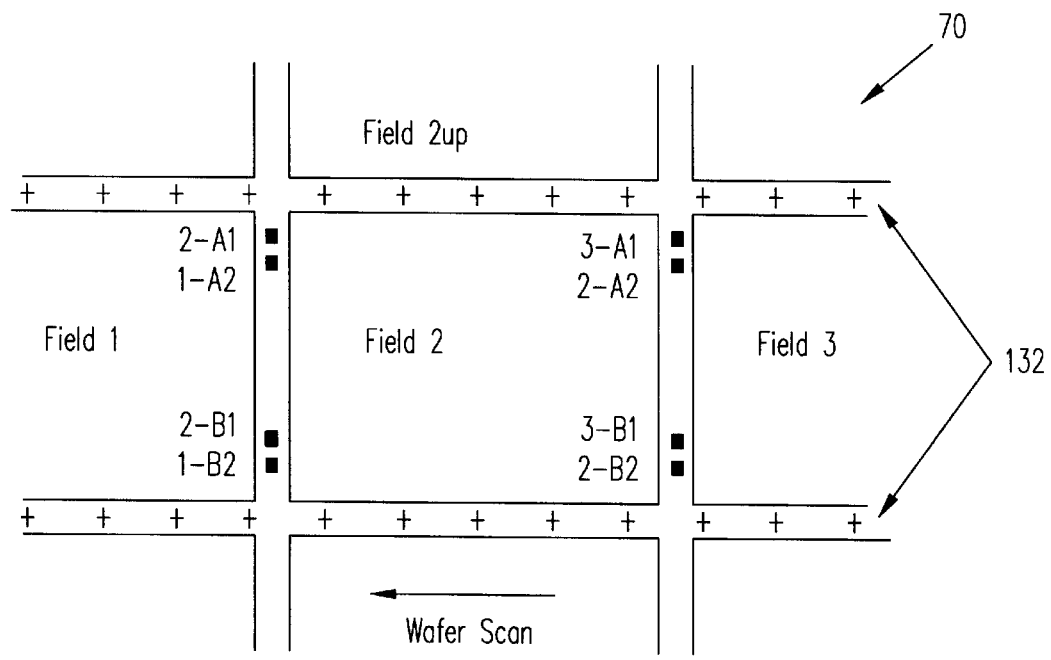

First is field by field (or site by site) alignment with measurement at start and end. Methods 1, 2, and 3 can be used to measure alignment at the start and the end of a scan. FIGS. 14a, 14b show the measurement positions. In FIG. 14a the reticle 10 layout is shown. The single chip pattern 130 is repeated on the wafer as Field 1, 2, 3, etc. in FIG. 14b. The process is:

a) At start of alignment, reticle alignments marks A1 and B1 are compared to wafer marks 2-A1 and 2-B1 as shown in FIG. 14b. Both the scan direction x and the orthogonal direction y are measured. These measurements yield the following Field 2 information:

Offset in x and y.

Magnification of reticle-lens-wafer in y direction.

Rotation of reticle relative to wafer or each field of the wafer.

b) After the scan of Field 2 from left to right, reticle marks A2 and B2 are compared with wafer marks 2-A2 and 2-B2. These measurements yield the following Field 2 information:

Magnification of reticle-interferometer-wafer in the x direction.

Skew of the scan.

Recheck of offsets and rotation.

c) After measurements a) and b) there are two possible sequences:

c-1) The reticle is moved back so that marks A1 and A2 now appear over wafer marks 3-A1 and 3-B1. Sequence a) and b) are repeated. Information from b) of Field 2 is used to adjust interferometer scale and skew for Field 3.

c-2) The wafer is stepped up so that Field 2up appears under the reticle. Now reticle marks A2 and B2 are compared with 2up-A2 and 2up-B2. Measurements a) are obtained. The field scan is then right-to-left. At the end of the scan, reticle marks A1 and B1 are compared with 2up-A1 and 2up-B1 and information as in b) is obtained.

Second is measurement of alignment marks at multiple points in the side kerf 132 of FIG. 14a. Method 1 and 2 are suitable only for measurements at the start and end of the scan field. With Method 3, measurements along the side kerf 132 are possible at multiple places. These measurements are indicated by the crosses in FIGS. 14a, 14b. In addition, the apparatus of FIGS. 12a, 12b allows measurement in the side kerf 132 by the conventional off-axis system. Using multiple measurements in the side kerf 132, periodic correction of the scan is achievable.

The above description is illustrative and not limiting; further modifications will be apparent to one skilled in the art in light of this disclosure and are intended to be covered by the appended claims.

We claim:

1. A method of determining misalignment of a photolithographic reticle to an object, the reticle and the object each having a mark formed thereon, comprising the steps of:

projecting through a projection optical system an image of the reticle mark towards a surface of the object using a first type of radiation and exposing a rectangular field on the surface of the object by moving the reticle and the object with respect to an optical field of the projection lens in a predetermined scan direction;

detecting radiation from the object mark located within the optical field of the projection optical system on the surface of the object and exterior of the rectangular field in the scan direction before or after the exposing of the rectangular field; and detecting radiation from the reticle mark to determine the misalignment between the reticle and the object.

2. The method of claim 1, further comprising the step of placing fluorescent enhancers on the surface of the object in the vicinity of the object mark, and wherein the detected radiation from the surface of the object includes fluorescence from the fluorescent enhancers.

3. The method of claim 1, wherein the first type of radiation includes a predetermined ultra violet wavelength, and the detected radiation from the surface of the object also includes the predetermined ultra violet wavelength.

4. The method of claim 1, wherein the step of detecting radiation includes detecting the first type of radiation reflected from the object mark.

5. The method of claim 1, wherein the step of detecting radiation comprises detecting the first type of radiation reflected from the surface of the object.

6. The method of claim 1, wherein.

the steps of detecting include providing a detector and locating at least a part of the detector intermediate an end of the projection lens closest to the surface of the object and the surface of the object.

7. The method of claim 6, further comprising the step of rigidly connecting the detector to a mount attached directly to the projection optical system.

8. The method of claim 1, further comprising the steps of:

providing a focusing lens and an apertured prism; and passing the radiation from the reticle mark through the apertured prism and the focusing lens prior to the step of detecting the radiation from the reticle mark.

9. The method of claim 8, wherein the apertured prism is non-reflective and defines at least four apertures.

10. The method of claim 1, further comprising the steps of:

providing an ellipsoidal reflector defining a plurality of apertures; and reflecting the radiation from the reticle mark from the ellipsoidal reflector prior to the step of detecting radiation.

11. The method of claim 1, wherein the steps of detecting comprise providing a detector adjacent the object and having a flat detecting surface in a plane parallel to a surface of the object and facing the surface of the object.

12. The method of claim 11, the detector defining two semi-circular cuts to allow the radiation from the reticle to pass.

13. The method of claim 1, wherein the detected image is detected at a location intermediate the surface of the object and an end of the projection optical system closest to the surface of the object.

14. The method of claim 1, wherein the radiation from the surface of the object is fluorescent radiation.

15. The method of claim 1, wherein the detected radiation from the surface of the object is detected without passing through any portion of the projection optical system.

16. The method of claim 1, wherein the radiation detected from the surface of the object is of the same type as the first type of radiation.

17. A photolithography alignment apparatus, comprising:

a reticle support;

an object support spaced apart from the reticle support;

a projection system intermediate the reticle support and the object support, thereby projecting an optical field onto an object on the object support and exposing an image of the reticle onto the object through a rectangular field located within the optical field, the rectangular field being elongated in a direction at an angle to a predetermined scan direction;

a controller for moving the reticle support and the object support with respect to the optical field of the projection system in the scan direction; and a detecting device located for detecting radiation from a surface of an object supported on the object support, the detected radiation being from a portion of the surface of the object in the optical field and outside the rectangular field in the scan direction.

18. The apparatus of claim 17, wherein the detecting device includes a detector for detecting fluorescent radiation from the surface of the object.

19. The apparatus of claim 18, wherein the detector includes:

an apertured optical element for passing radiation from the projection system to the object and receiving radiation generated from the object; and a detector element for receiving the radiation generated from the object through the optical element.

20. The apparatus of claim 18, wherein the detector comprises a plate having a flat detecting surface in a plane parallel to a surface of the object.

21. The apparatus of claim 20, the plate defining at least two cut outs, the two cut outs allowing radiation to pass from the projection system to the object.

22. The apparatus of claim 18, the detecting device further comprising:

a lens for focusing the radiation from the object; and an alignment mechanism rigidly connecting the detector to the projection system.

23. The apparatus of claim 17, the detecting device being located to detect the radiation from the object without the radiation from the object passing through any part of the projection optical system.

24. A photolithographic scanning exposure and alignment apparatus, comprising:

(a) a reticle stage supporting a reticle which has a pattern and is movable in a scanning direction;

(b) an object stage supporting a substrate to be exposed by the pattern of the reticle and movable in a scanning direction;

(c) a projection optical system disposed between the reticle and the substrate, and having an image field capable of imaging and an effective exposure field defined as a rectangle elongated in a direction at an angle to the scanning direction and located within the image field, wherein the exposure field is used for a scanning exposure of the substrate; and (d) a detecting device having a detection site located exterior of the exposure field with respect to the scanning direction and located in the image field, for detecting radiation from a mark pattern formed on the substrate.

25. The apparatus of claim 24, wherein the detecting device has a first detecting system which has two detection sites located at one side of the effective exposure field with respect to the scanning direction, and a second detecting system which has two detection sites located at another side of the effective exposure field with respect to the scanning direction.

26. The apparatus of claim 25, wherein the first detecting system detects a first mark pattern formed at one side of an exposed field of the substrate with respect to the scanning direction, before the exposed field reaches the effective exposure field.

27. The apparatus of claim 26, wherein the second detecting system detects a second mark pattern formed at another side of the exposed field with respect to the scanning direction after the exposed field is out of the effective exposure field.

28. The apparatus of claim 27, further comprising:
a control system for driving the reticle stage and the object stage relative to one another when the scanning exposure operation and the control system determine a relative magnification in the scanning direction in accordance with detecting results of the first and second detecting systems.

29. A scanning exposure method for projecting a pattern on a reticle onto a substrate through a projection system having an image field while scanning the reticle and substrate, the method comprising the steps of:
(a) defining a rectangular exposing field located within the image field of the projection system, the exposing field being elongated in a direction at an angle to the scanning direction;
(b) projecting an image of a reticle mark onto the substrate through a detection site located in the image field of the projection system and located exterior of the exposing field of the projection system with respect to the scanning direction;
(c) detecting a first radiation from the image of the reticle mark formed on a sensitive surface of the substrate and a second radiation from a substrate mark formed on the substrate through the detection site defined between the projection system and the substrate; and
(d) relatively aligning the reticle and the substrate in accordance with the detected radiations and scanning the reticle and the substrate relative to the projection system for scanning exposure.

30. A scanning exposure method for exposing a pattern of a reticle onto a substrate through a projection system having an image field while scanning the reticle and the substrate, the method comprising the steps of:
(a) defining a slit-shaped exposing field located within the image field of the projection system, the slit-shape of the exposing field being extended in a direction at an angle to the scanning direction;
(b) detecting first alignment information from a first mark formed at a scanning start portion of a first field area of the substrate through the first detection site located at one side of and exterior to the exposing field and in the image field when starting of scanning of the first field area;
(c) detecting second alignment information from a second mark formed at a scanning end portion of the first field area through a second detection site located at an opposite side of and exterior to the exposing field and in the image field at an end of scanning of the first field area; and
(d) scanning a second field area of the substrate and the reticle with respect to the projection system, in accordance with the first and second alignment information.

* * * * *